US011081857B2

(12) United States Patent
Ohkubo

(10) Patent No.: US 11,081,857 B2
(45) Date of Patent: Aug. 3, 2021

(54) SEMICONDUCTOR LASER DEVICE AND MANUFACTURING METHOD THEREFOR

(71) Applicant: SHARP KABUSHIKI KAISHA, Sakai (JP)

(72) Inventor: Nobuhiro Ohkubo, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 8 days.

(21) Appl. No.: 16/700,594

(22) Filed: Dec. 2, 2019

(65) Prior Publication Data

US 2020/0185878 A1 Jun. 11, 2020

Related U.S. Application Data

(60) Provisional application No. 62/776,343, filed on Dec. 6, 2018.

(51) Int. Cl.
*H01S 5/0234* (2021.01)
*H01S 5/0231* (2021.01)
*H01S 5/02355* (2021.01)

(52) U.S. Cl.
CPC .......... *H01S 5/0234* (2021.01); *H01S 5/0231* (2021.01); *H01S 5/02355* (2021.01)

(58) Field of Classification Search
CPC .. H01S 5/0234; H01S 5/0231; H01S 5/02257; H01S 5/02355; H01S 5/022
USPC ................... 372/43.01; 257/E23.031, 670
See application file for complete search history.

(56) References Cited

U.S. PATENT DOCUMENTS

| | | | |
|---|---|---|---|
| 8,368,098 B2 * | 2/2013 | Kawaguchi | B82Y 20/00 257/98 |
| 2003/0178711 A1 * | 9/2003 | Honda | H01L 33/62 257/676 |
| 2005/0286581 A1 * | 12/2005 | Shinohara | H01S 5/0231 372/43.01 |

* cited by examiner

*Primary Examiner* — Tuan N Nguyen
(74) *Attorney, Agent, or Firm* — ScienBiziP, P.C.

(57) ABSTRACT

A semiconductor laser device includes a semiconductor laser element, a sub mount member, a mount section having an upper surface on which the semiconductor laser element is mounted with the sub mount member interposed therebetween, a lead pin disposed at left and right sides of the mount section, a retainer that retains the mount section and the lead pin together and that is composed of an insulative material, and a protrusion protruding toward the left and right sides of the mount section. A lower surface of the mount section is parallel to an upper surface of the mount section and protrudes from a lower surface of the retainer.

11 Claims, 4 Drawing Sheets

SEMICONDUCTOR LASER DEVICE AND MANUFACTURING METHOD THEREFOR

BACKGROUND OF INVENTION

Technical Field

The present invention relates to semiconductor laser devices and manufacturing methods for the semiconductor laser devices.

Related Art

Semiconductor laser devices are used for various purposes and are used in various industrial fields. Due to such backgrounds, the market demands with respect to semiconductor laser devices have diversified, and the demands for higher output and higher guaranteed operating temperature in semiconductor laser elements are becoming strict.

As semiconductor laser devices in the related art, frame-type semiconductor laser devices as disclosed in, for example, Japanese Unexamined Patent Application Publication Nos. 2005-311147 and 2003-289167 are known.

FIG. 7 is a plan view illustrating a frame-type semiconductor laser device 100 in the related art. As shown in the drawing, the semiconductor laser device 100 includes a metallic lead frame 120, a plurality of lead pins 103 that are to serve as electrodes, and a retainer 107 that retains the lead frame 120 and the plurality lead pins 103 together. The lead frame 120 has an element mount section 121, a lead section 122, and a tie-bar section 123. The element mount section 121 has a semiconductor laser element 110 mounted thereon with a sub mount member 108 interposed therebetween.

The element mount section 121 is exposed from the retainer 107, and the tie-bar section 123 protrudes from the element mount section 121. The undersurface of the element mount section 121 is flush with the undersurface of the retainer 107, and the lead pins 103 are disposed at the underside relative to the semiconductor laser element 110.

The semiconductor laser device 100 of the frame type described above still has room for improvement with respect to the aforementioned market demands. Specifically, although it is necessary to further increase the heat dissipation properties to achieve higher output of the semiconductor laser element 110, it is difficult to improve the heat dissipation properties due to the retainer 107 being flush with the undersurface of the element mount section 121. Moreover, in addition to having a problem of being easily deformable by external pressure due to the element mount section 121 having a small thickness, the semiconductor laser device 100 described above is problematic in that, if a floating wire electrically isolated from the element mount section 121 is to be connected or a plurality of wires are to be connected, the wire or wires become long.

SUMMARY OF INVENTION

An object of the present invention is to provide a semiconductor laser device and a manufacturing method therefor that can improve the heat dissipation properties even if the output of a semiconductor laser element is increased, can suppress deformation caused by external pressure, and allow for connection of floating wires electrically isolated from a mount section of the semiconductor laser element even if the wires are short.

(1) An embodiment of the present invention provides a semiconductor laser device equipped with a semiconductor laser element and including the semiconductor laser element; a sub mount member; a mount section having an upper surface on which the semiconductor laser element is mounted with the sub mount member interposed therebetween; a lead pin disposed at left and right sides of the mount section and extending in a front-rear direction, wherein an output direction in which a main beam is output from the semiconductor laser element is defined as a front direction, a direction parallel to the output direction is defined as the front-rear direction, and a direction orthogonal to the front-rear direction is defined as a left-right direction; a retainer that retains the mount section and the lead pin together and that is composed of an insulative material; and a protrusion protruding toward the left and right sides of the mount section and constituted by a part of a tie bar. A lower surface of the mount section is parallel to an upper surface of the mount section and protrudes from a lower surface of the retainer.

(2) The semiconductor laser device according to an embodiment of the present invention is characterized in that, in addition to the configuration (1) described above, the mount section has various thicknesses in the front-rear direction and the left-right direction of the mount section such that a thickness in a peripheral area surrounding a central area is smaller than a thickness in the central area.

(3) The semiconductor laser device according to an embodiment of the present invention is characterized in that, in addition to the configuration (1) described above, a thickness of the lead pin in an up-down direction is equal to the thickness of the peripheral area of the mount section.

(4) The semiconductor laser device according to an embodiment of the present invention is characterized in that, in addition to the configuration (1) described above, the retainer is open in the front direction and allows a part of the protrusion to protrude in the left-right direction, and a peripheral area of the mount section is clamped by the retainer in an up-down direction and the left-right direction.

(5) The semiconductor laser device according to an embodiment of the present invention is characterized in that, in addition to the configuration (1) described above, the lead pin extends through the retainer and has a bent section bent in an up-down direction in an area provided inside the retainer.

(6) The semiconductor laser device according to an embodiment of the present invention is characterized in that, in addition to the configuration (1) described above, the lead pin has an area clamped by the retainer from two directions including an up-down direction and the left-right direction.

(7) The semiconductor laser device according to an embodiment of the present invention is characterized in that, in addition to the configuration (1) described above, an outermost surface of each of the retainer and the lead pin is plated with metal having high solder wettability.

(8) The semiconductor laser device according to an embodiment of the present invention is characterized in that, in addition to the configuration (1) described above, each of the retainer and the lead pin has a copper core.

(9) The semiconductor laser device according to an embodiment of the present invention is characterized in that, in addition to the configuration (1) described above, the retainer has a frame section disposed around the semiconductor laser element. The frame section includes a window that is open in the front direction and that is for outputting the main beam from the semiconductor laser element, and also includes an opening through which an upper surface of the lead pin is exposed. An upper surface of the semiconductor laser element and the upper surface of the lead pin are connected by a wire via the opening.

(10) The semiconductor laser device according to an embodiment of the present invention is characterized in that, in addition to the configuration (1) described above, the retainer has a frame section disposed surrounding the sub mount member. The frame section includes an opening through which an upper surface of the lead pin is exposed. An upper surface of the sub mount member and the upper surface of the lead pin are connected by a wire via the opening.

(11) The semiconductor laser device according to an embodiment of the present invention is characterized in that, in addition to the configuration (1) described above, the lead pin is disposed at left and right sides of the semiconductor laser element.

(12) The semiconductor laser device according to an embodiment of the present invention is characterized in that, in addition to the configuration (1) described above, the semiconductor laser element is configured to radiate a plurality of laser beams having identical or different oscillation wavelengths.

(13) An embodiment of the present invention provides a manufacturing method for the semiconductor laser device having any one of the configurations (1) to (12) described above and including a punching step for punching a metallic plate material to obtain the mount section and the lead pin that are linked by a tie bar; a step for forming a bent section in the lead pin obtained in the punching step; a resin molding step for providing the mount section and the lead pin with a retainer by performing resin molding using a mold; a die bonding step for mounting the semiconductor laser element onto the mount section with the sub mount member interposed therebetween; and a wire bonding step for connecting a wire between the semiconductor laser element and the lead pin and between the sub mount member and the lead pin.

According to the present invention, the heat dissipation properties can be improved, deformation caused by external pressure can be suppressed, and a plurality of floating wires electrically isolated from the mount section can be connected by using short wires.

DESCRIPTION OF EMBODIMENTS

A semiconductor laser device and a manufacturing method therefor according to an embodiment of the present invention will be described below with reference to the drawings.

Figure 1:
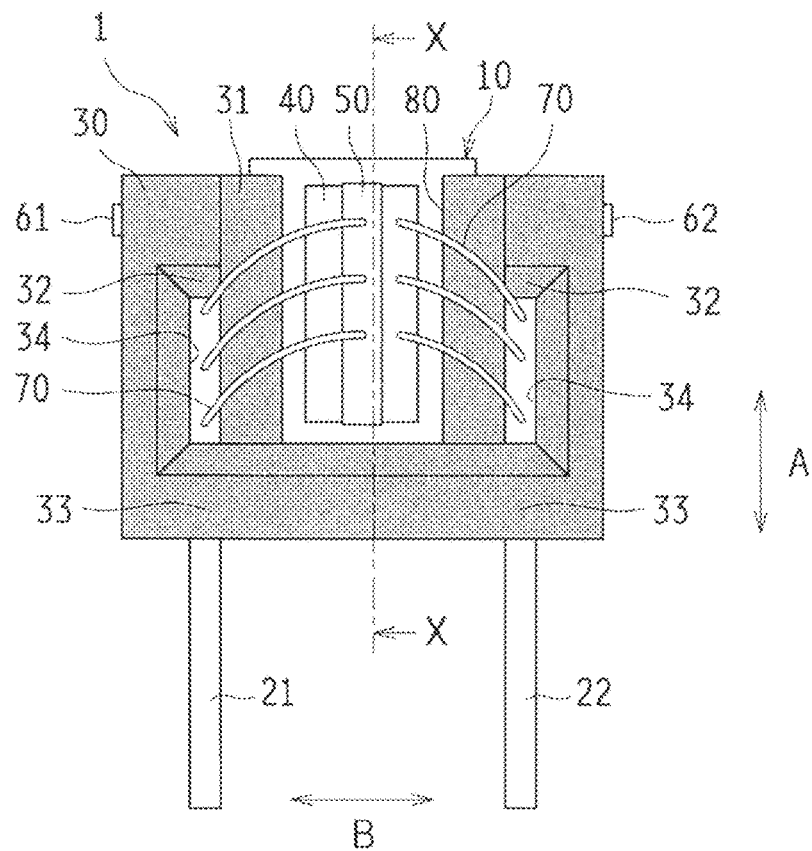
FIG. 1 is a plan view schematically illustrating a semiconductor laser device according to an embodiment of the present invention.
Figure 2:
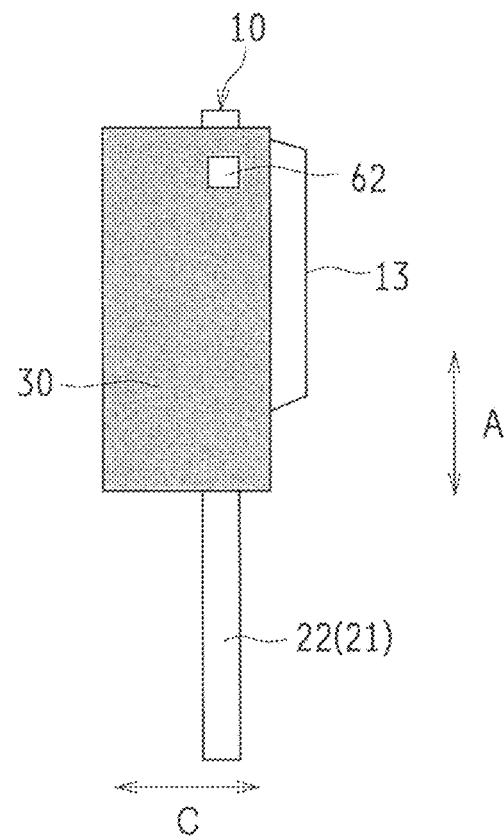
FIG. 2 is a side view of the semiconductor laser device.
Figure 3:
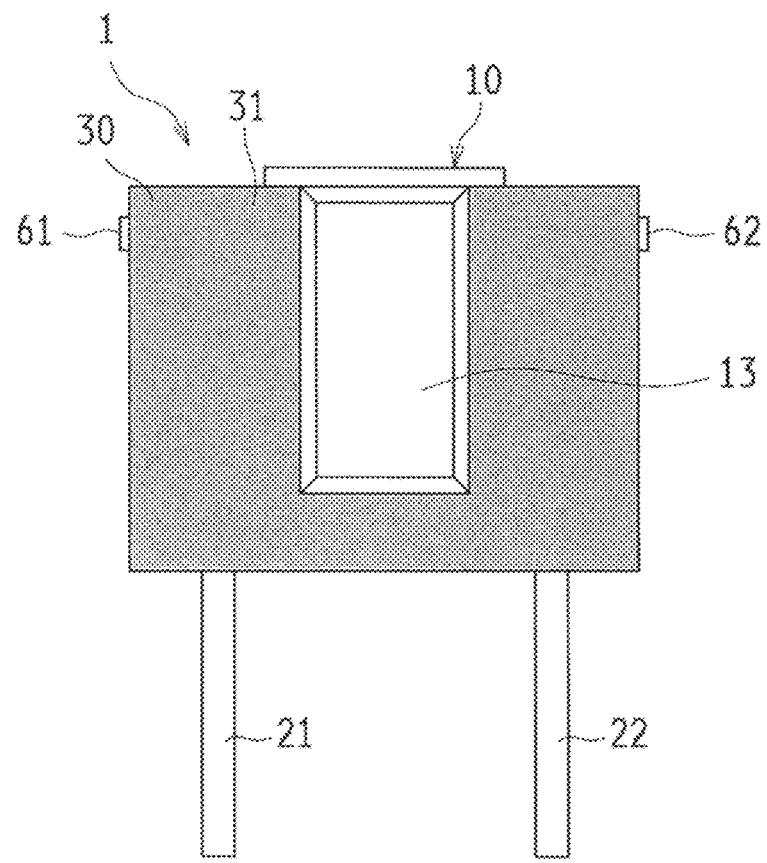
FIG. 3 is a bottom view of the semiconductor laser device.
Figure 4:
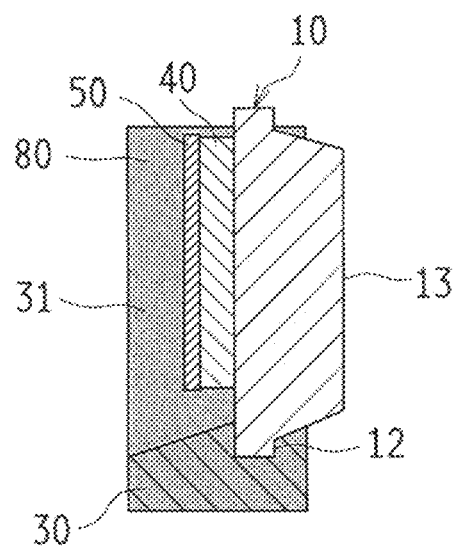
FIG. 4 is a cross-sectional view of the semiconductor laser device, taken along line X-X.
Figure 5:
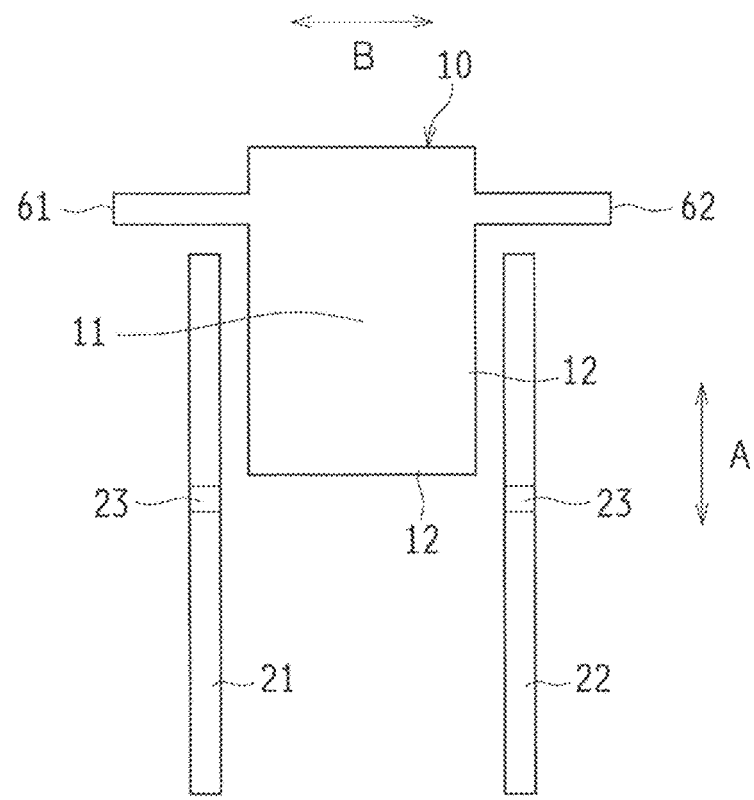
FIG. 5 is a plan view illustrating a mount section and lead pins in the semiconductor laser device.

FIG. 1 is a plan view schematically illustrating a semiconductor laser device 1 according to an embodiment of the present invention, FIG. 2 is a side view thereof, and FIG. 3 is a bottom view thereof. FIG. 4 is a cross-sectional view taken along line X-X in FIG. 1, and FIG. 5 is a plan view illustrating a mount section 10 and lead pins 21 and 22, from which a retainer 30 in FIG. 1 has been removed.

In the description related to the following embodiment, the upper side and the lower side in the plane of the drawings in FIGS. 1 and 2 are defined as "front direction" and "rear direction", respectively, a direction parallel to these directions is defined as "front-rear direction A", and a lateral direction in the plane of the drawings is defined as "left-right direction B". Furthermore, a direction orthogonal to the plane of the drawing in FIG. 1 is defined as "up-down direction C" (see FIG. 2), and the direction extending toward the front of the plane of the drawing is defined as "up direction". These directions are used for the sake of convenience for the following description and are not intended to limit the directional properties of the semiconductor laser device 1.

The semiconductor laser device 1 relates to a frame-type semiconductor laser device. As shown in FIG. 1, the semiconductor laser device 1 includes a semiconductor laser element 50, a sub mount member 40, the mount section 10, the lead pins 21 and 22, and protrusions 61 and 62 protruding from the mount section 10.

The semiconductor laser element 50 outputs a laser beam (main beam) in the front direction. In FIG. 1, a direction parallel to this output direction (optical-axis direction) is indicated as the front-rear direction A in the semiconductor laser device 1. The semiconductor laser element 50 has a substantially rectangular-parallelepiped outer shape that is narrow and long in the front-rear direction A. The semiconductor laser element 50 is mounted on the upper surface of the mount section 10 with the sub mount member 40 interposed therebetween.

As shown in FIG. 5, the mount section 10 has the protrusion 61 continuing from the upper surface of the mount section 10 and protruding in the left direction, and also has the protrusion 62 protruding in the right direction. Furthermore, as shown in FIG. 1, the sub mount member 40 having a substantially rectangular-parallelepiped shape and being a plate-like body is disposed on the upper surface of the mount section 10. The sub mount member 40 is disposed in a central area 11 of the upper surface of the mount section 10. As shown in FIG. 5, the protrusions 61 and 62 extend in the left-right direction B from a peripheral area 12 surrounding the central area 11 of the mount section 10.

The protrusions 61 and 62 are respectively provided at the left and right sides of the mount section 10 and are each constituted by a part of a tie bar. The width of the protrusions 61 and 62, that is, the width in the direction orthogonal to the protruding direction, is larger than the width of the semiconductor laser element 50 (i.e., the width in the direction orthogonal to the optical-axis direction of the laser beam output from the semiconductor laser element 50).

The mount section 10 and the two lead pins 21 and 22 for inputting and outputting signals are retained together by the retainer 30. The retainer 30 is composed of, for example, a black insulative material. An example of the insulative material constituting the retainer 30 includes epoxy resin as an insulative synthetic resin material. Accordingly, the retainer 30 having insulation properties can be obtained by molding using a mold.

Because the retainer 30 is black, when the semiconductor laser device 1 is in operation, reflection light from a laser-beam-irradiation target, such as an information recording medium, is prevented from being absorbed and reflected by the retainer 30 even if the reflection light enters the retainer 30. As a result, in an apparatus that uses the semiconductor laser device 1, the reflection light from the laser-beam-irradiation target is prevented from being a cause of noise.

As shown in FIG. 1, the two lead pins 21 and 22 are strip-shaped members extending in the front-rear direction A and are respectively disposed at the left and right sides of the mount section 10. The thickness of the lead pins 21 and 22 in the up-down direction C is the same as the thickness of the peripheral area 12 of the mount section 10.

Figure 6:
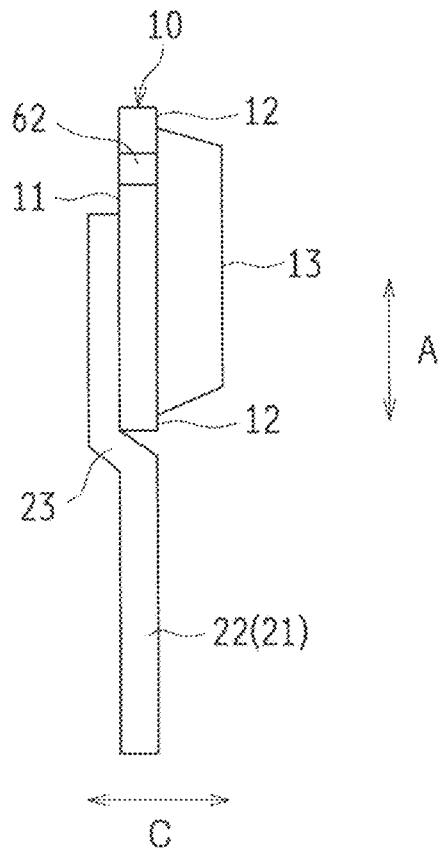
FIG. 6 is a side view illustrating the arrangement of the mount section and the lead pins.
Figure 7:
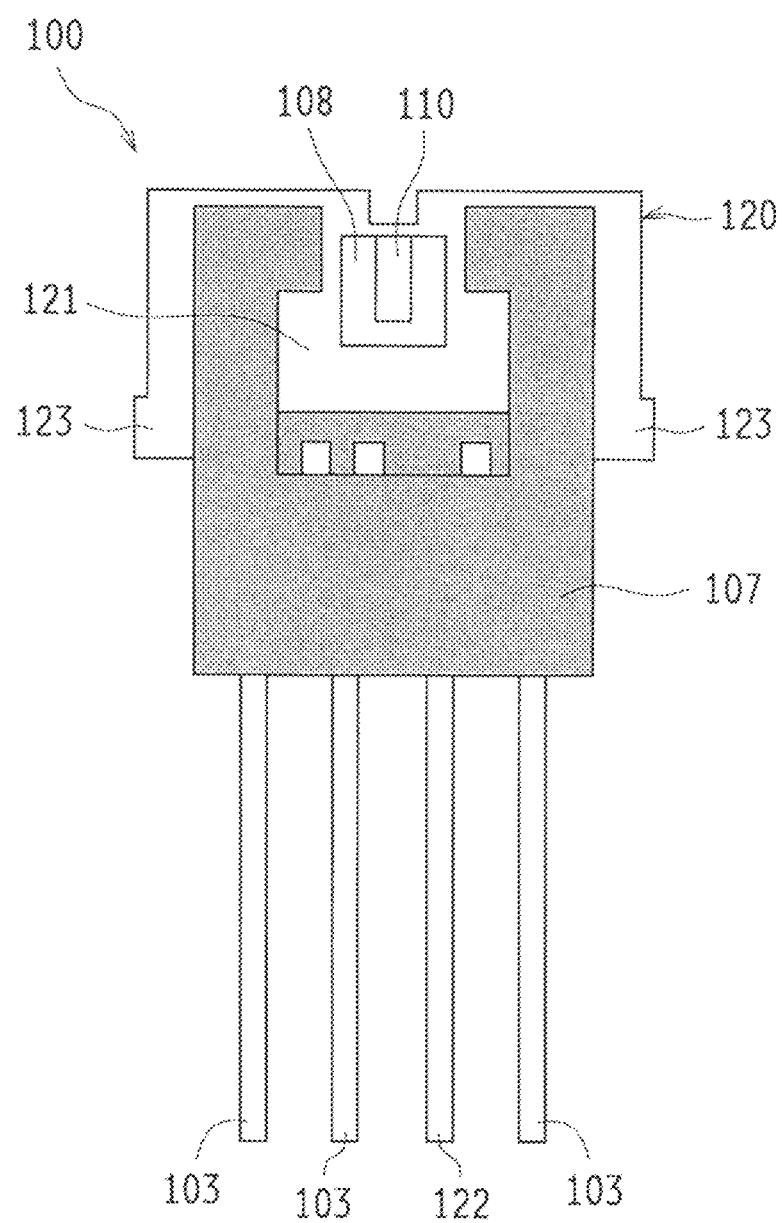
FIG. 7 is a plan view illustrating a semiconductor laser device in the related art.

FIG. 6 is a side view illustrating the arrangement of the mount section 10 and the lead pins 21 and 22 in the semiconductor laser device 1. As shown in FIGS. 5 and 6, the lead pins 21 and 22 have first ends, in the front-rear direction A, disposed adjacent to the mount section 10, and second ends extending from the mount section 10 (i.e., extending in the rear direction of the front-rear direction A). In this embodiment, the peripheral area 12 of the mount section 10 and the lead pins 21 and 22 have the same thickness of 0.3 mm in the up-down direction C.

With regard to the mount section 10, the thickness thereof in the central area 11 is smaller than the thickness thereof in the peripheral area 12 surrounding the central area 11. The thickness of the mount section 10 (i.e., the thickness in the up-down direction C) varies and is not uniform in the front-rear direction A and the left-right direction B.

Accordingly, the central area 11 of the mount section 10 has a thickness larger than that of the lead pins 21 and 22 having the same thickness as the peripheral area 12. A lower surface 13 of the mount section 10 protrudes further in the down direction than the lower surface of the lead pins 21 and 22. In this embodiment, the thickness of the peripheral area 12 of the mount section 10 in the up-down direction C is 0.3 mm, and the thickness of the central area 11 of the mount section 10 in the up-down direction C is 0.9 mm.

Because the mount section 10 has such a shape, the lower surface 13 of the mount section 10 is exposed at the lower surface of the retainer 30 and protrudes further than the lower surface of the retainer 30, as shown in FIG. 2. Furthermore, the lower surface 13 of the mount section 10 is parallel to the upper surface of the mount section 10 and is also a flat surface.

The lead pins 21 and 22 extend through the retainer 30 from the interior of the retainer 30 to the exterior of the retainer 30. The lead pins 21 and 22 each have a bent portion 23 inside the retainer 30. The bent portion 23 is bent in the up-down direction C at an intermediate point in the lengthwise direction in the corresponding lead pin 21 or 22.

As shown in FIG. 6, the upper and lower surfaces of segments extending in the rear direction from the bent portions 23 of the lead pins 21 and 22 (i.e., segments extending from the mount section 10) are respectively parallel to the upper and lower surfaces of the peripheral area 12 of the mount section 10. With regard to the lead pins 21 and 22, two or more lead pins may be provided in accordance with the number of signal inputs and outputs.

With respect to the above-described configurations of the mount section 10 and the lead pins 21 and 22, the retainer 30 has a frame section 31 formed on the upper surface of the mount section 10. As shown in FIG. 1, the frame section 31 is mounted on the upper surface of the mount section 10 and surrounds the semiconductor laser element 50 and the sub mount member 40. With regard to the peripheral area 12 on the upper surface of the mount section 10, the opposite ends in the left-right direction B and the rear end in the front-rear direction are covered by the frame section 31.

The frame section 31 of the retainer 30 has a window 80 that is open in the front direction of the front-rear direction A toward the front end of the semiconductor laser element 50. The window 80 allows the laser beam output from the semiconductor laser element 50 to pass therethrough. Accordingly, the frame section 31 is provided with a gap so as not to come into contact with the opposite sides of the semiconductor laser element 50 in the left-right direction B and the rear side surface thereof in the front-rear direction A.

The left and right sides of the frame section 31 in the retainer 30 are individually provided with openings 34. The openings 34 have a rectangular slot shape that is long in the front-rear direction A. The upper surfaces of the lead pins 21 and 22 retained by the retainer 30 are exposed through the respective openings 34.

Furthermore, as shown in FIG. 1, the ends of the protrusions 61 and 62 protrude from the side surfaces of the retainer 30 in the left-right direction B. As shown in FIG. 2, the end of the protrusion 62 is exposed at the corresponding side surface of the retainer 30.

As shown in FIG. 3, the lower surface of the retainer 30 in the up-down direction C retains the mount section 10 such that the lower surface 13 thereof is exposed. At the lower surface, the retainer 30 covers the peripheral area 12 of the mount section 10 and the lead pins 21 and 22.

Accordingly, in the semiconductor laser device 1, the mount section 10, excluding a part thereof in the front direction in which the laser beam is output from the semiconductor laser element 50, the central area 11 on which the semiconductor laser element 50 is mounted, and the protrusions 61 and 62 protruding in the left-right direction B, is retained by being clamped by the retainer 30 (see FIG. 4).

Each of the lead pins 21 and 22 is clamped by the retainer 30 from two directions, namely, the left-right direction B and the up-down direction C. In the exemplified embodiment, as shown in FIG. 1, the retainer 30 is provided with a front-end retainer 32 that retains the front ends of the lead pins 21 and 22 and an intermediate retainer 33 that retains intermediate segments. The rear ends of the lead pins 21 and 22 are exposed from the retainer 30 in the rear direction of the front-rear direction A. The retainer 30 has the two openings 34 between the front-end retainer 32 and the intermediate retainer 33, and allows the upper surfaces of the lead pins 21 and 22 to be exposed through these openings 34.

Each of the openings 34 preferably has a tapered inner wall surface so as to become wider toward the upper surface of the retainer 30. The inner wall surface of the intermediate retainer 33 in the front direction is also preferably tapered so as to become wider toward the upper surface of the retainer 30.

As shown in FIG. 1, the upper surface of the semiconductor laser element 50 and the upper surface of the one lead pin 21 exposed through the corresponding opening 34 are connected by wires 70 through the opening 34. The upper surface of the sub mount member 40 and the upper surface of the other lead pin 22 are connected by wires 70 through the corresponding opening 34. The semiconductor laser element 50 and the lead pin 21 are connected to each other by a plurality of wires 70, and the sub mount member 40 and the lead pin 22 are connected to each other by a plurality of wires 70. These wires 70 are preferably composed of Au (gold).

It is preferable that the mount section 10 and the lead pins 21 and 22 be formed of Cu (copper) cores, and that the outermost surfaces of the mount section 10 and the lead pins 21 and 22 be plated with metal having high solder wettability. For example, it is preferable that the cores be composed of Cu, and that the plating metal used be Ag (silver). The plating metal for the outermost surfaces is not limited to this, and may be Sn (tin), Ni (nickel), or Zn (zinc) that can enhance the solder wettability.

The semiconductor laser element 50 may be configured to radiate a plurality of laser beams having identical or different oscillation wavelengths. In this embodiment, a 638-nm band red-color high-output semiconductor laser element may be used as the semiconductor laser element 50.

As shown in FIG. 4, the semiconductor laser device 1 is provided such that the lower surface 13 of the mount section 10 protrudes from the retainer 30, so that only the lower surface 13 of the mount section 10 exists in the same plane as the lower surface 13 of the mount section 10. Therefore, the lower surface 13 of the mount section 10 can be readily joined to an external heat dissipation plate of the semiconductor laser device 1.

Therefore, a large contact area can be ensured between the lower surface 13 of the mount section 10 functioning as a heat dissipater for the semiconductor laser device 1 and the external heat dissipation plate (not shown), and the heat of the semiconductor laser element 50 can be efficiently dissipated outside the semiconductor laser device 1 via the sub mount member 40 and the mount section 10.

As a result, the semiconductor laser device 1 can achieve higher output of the semiconductor laser element 50 and can also improve the heat dissipation properties. Furthermore, due to having a sufficient thickness in the up-down direction C, the mount section 10 is less likely to deform in response to external pressure. In addition, even if a floating wire electrically isolated from the mount section 10 is to be connected or a plurality of wires are to be connected, the wire or wires can have a shorter length than in the related art, as mentioned above.

In the semiconductor laser device 1 according to this embodiment, the retainer 30 can be formed readily by resin molding using a mold. Alternatively, the retainer 30 may be formed to have a similar shape by using, for example, a ceramic material instead of an insulative synthetic resin material. Even if the retainer 30 is composed of a ceramic material, the heat dissipation properties can still be improved similarly to the above description. The shapes of the openings 34 and the window 80 provided in the retainer 30 are not limited to those described above and may be any shape.

The semiconductor laser device 1 having the above-described configuration can be manufactured in accordance with the following steps.

The manufacturing method for the semiconductor laser device 1 first involves punching a metallic plate material to obtain a frame including a mount section 10 and lead pins 21 and 22 (punching step). A Cu (copper) plate material may be used as the aforementioned plate material. The punching is preferably performed from the lower surface of the mount section 10 so that burrs occurring as a result of the punching appear from the upper surface of the mount section 10, thereby increasing the adhesion between the lower surface 13 of the mount section 10 and another device and improving the heat dissipation properties.

At this stage, the mount section 10 and the lead pins 21 and 22 are linked by tie bars. The frame has a plurality of sets of mount sections 10 and lead pins 21 and 22.

Subsequently, the outermost surface of the punched frame is metal-plated with Ag (silver) (plating step). Accordingly, the solder wettability can be improved when the lead pins 21 and 22 are to be soldered. Moreover, each of the lead pins 21 and 22 is bent so that a bent portion 23 is formed.

Then, a retainer 30 is formed by resin molding using a mold (resin molding step). A frame section 31 and openings 34 are formed in the retainer 30.

Subsequently, a semiconductor laser element 50 is mounted on the upper surface of the mount section 10 with a sub mount member 40 interposed therebetween (die bonding step). Then, wires 70 composed of Au (gold) are wired from the semiconductor laser element 50 and the sub mount member 40 to the lead pins 21 and 22 (wire bonding step).

Subsequently, the tie bars are cut so that individual semiconductor laser devices 1 are obtained (tie-bar cutting step). In this case, the protrusions 61 and 62 and the lead pins 21 and 22 are left remaining in a protruding state from the retainer 30 of each semiconductor laser device 1.

The semiconductor laser device 1 is readily manufactured in this manner. Because the lead pins 21 and 22 are provided with the bent portions 23, the bent portions 23 have a retaining function within the retainer 30. When the lead pins 21 and 22 are to be soldered at a stage of mounting the semiconductor laser device 1 to, for example, an optical pickup device, even if the material constituting the retainer 30 softens due to the heat of the solder, the bent portions 23 prevent the lead pins 21 and 22 from falling out.

Because the lead pins 21 and 22 are integrated with the retainer 30 by extending therethrough and are retained by being clamped by the front-end retainer 32 and the intermediate retainer 33, the lead pins 21 and 22 have increased joint strength with the mount section 10 without moving relative to the retainer 30. This allows for a stable soldering process and higher productivity.

Accordingly, as described above, the semiconductor laser device 1 and the manufacturing method therefor according to the present invention can achieve improved heat dissipation properties, as compared with the related art. In particular, even if the output of the semiconductor laser element 50 is increased, the contact area between the mount section 10, which is less likely to deform, and the sub mount member 40 can be increased, and the contact area between the lower surface 13 of the mount section 10 and the external heat dissipation plate can be increased, thereby significantly improving the heat dissipation properties.

The embodiment of the semiconductor laser device and the manufacturing method therefor according to the present invention has been described above. However, the present invention is not limited to the configuration described above, and various modifications are possible within the scope indicated in the claims. An embodiment obtained by appropriately combining technical means disclosed in different embodiments is also included in the technical scope of the present invention. Moreover, by combining the technical means disclosed in the embodiments, new technical characteristics can be obtained.

The invention claimed is:

1. A semiconductor laser device equipped with a semiconductor laser element, the semiconductor laser device comprising:
   the semiconductor laser element;
   a sub mount member;
   a mount section having an upper surface on which the semiconductor laser element is mounted with the sub mount member interposed therebetween;
   a lead pin disposed at left and right sides of the mount section and extending in a front-rear direction, wherein an output direction in which a main beam is output from the semiconductor laser element is defined as a front direction, a direction parallel to the output direction is defined as the front-rear direction, and a direction orthogonal to the front-rear direction is defined as a left-right direction;

a retainer that retains the mount section and the lead pin together and that is composed of an insulative material; and a protrusion protruding toward the left and right sides of the mount section and constituted by a part of a tie bar, wherein a lower surface of the mount section is parallel to an upper surface of the mount section and protrudes from a lower surface of the retainer, and wherein each of the retainer and the lead pin has a copper core.

2. The semiconductor laser device according to claim 1, wherein the mount section has various thicknesses in the front-rear direction and the left-right direction of the mount section such that a thickness in a peripheral area surrounding a central area is smaller than a thickness in the central area.

3. The semiconductor laser device according to claim 2, wherein a thickness of the lead pin in an up-down direction is equal to the thickness of the peripheral area of the mount section.

4. The semiconductor laser device according to claim 1, wherein the retainer is open in the front direction and allows a part of the protrusion to protrude in the left-right direction, and wherein a peripheral area of the mount section is clamped by the retainer in an up-down direction and the left-right direction.

5. The semiconductor laser device according to claim 1, wherein the lead pin extends through the retainer and has a bent section bent in an up-down direction in an area provided inside the retainer.

6. The semiconductor laser device according to claim 1, wherein the lead pin has an area clamped by the retainer from two directions including an up-down direction and the left-right direction.

7. The semiconductor laser device according to claim 1, wherein an outermost surface of each of the retainer and the lead pin is plated with metal having high solder wettability.

8. The semiconductor laser device according to claim 1, wherein the lead pin is disposed at left and right sides of the semiconductor laser element.

9. The semiconductor laser device according to claim 1, wherein the semiconductor laser element is configured to radiate a plurality of laser beams having identical or different oscillation wavelengths.

10. A semiconductor laser device equipped with a semiconductor laser element, the semiconductor laser device comprising:

the semiconductor laser element;
a sub mount member;
a mount section having an upper surface on which the semiconductor laser element is mounted with the sub mount member interposed therebetween;
a lead pin disposed at left and right sides of the mount section and extending in a front-rear direction, wherein an output direction in which a main beam is output from the semiconductor laser element is defined as a front direction, a direction parallel to the output direction is defined as the front-rear direction, and a direction orthogonal to the front-rear direction is defined as a left-right direction;
a retainer that retains the mount section and the lead pin together and that is composed of an insulative material; and
a protrusion protruding toward the left and right sides of the mount section and constituted by a part of a tie bar,
wherein a lower surface of the mount section is parallel to an upper surface of the mount section and protrudes from a lower surface of the retainer,
wherein the retainer has a frame section disposed around the semiconductor laser element,
wherein the frame section includes a window that is open in the front direction and that is for outputting the main beam from the semiconductor laser element, and also includes an opening through which an upper surface of the lead pin is exposed, and
wherein an upper surface of the semiconductor laser element and the upper surface of the lead pin are connected by a wire via the opening.

11. A semiconductor laser device equipped with a semiconductor laser element, the semiconductor laser device comprising:

the semiconductor laser element;
a sub mount member;
a mount section having an upper surface on which the semiconductor laser element is mounted with the sub mount member interposed therebetween;
a lead pin disposed at left and right sides of the mount section and extending in a front-rear direction, wherein an output direction in which a main beam is output from the semiconductor laser element is defined as a front direction, a direction parallel to the output direction is defined as the front-rear direction, and a direction orthogonal to the front-rear direction is defined as a left-right direction;
a retainer that retains the mount section and the lead pin together and that is composed of an insulative material; and
a protrusion protruding toward the left and right sides of the mount section and constituted by a part of a tie bar,
wherein a lower surface of the mount section is parallel to an upper surface of the mount section and protrudes from a lower surface of the retainer,
wherein the retainer has a frame section disposed surrounding the sub mount member,
wherein the frame section includes an opening through which an upper surface of the lead pin is exposed, and
wherein an upper surface of the sub mount member and the upper surface of the lead pin are connected by a wire via the opening.

* * * * *